(12) United States Patent
Lee et al.

(10) Patent No.: US 7,833,350 B2
(45) Date of Patent: Nov. 16, 2010

(54) APPARATUS FOR TREATING THIN FILM AND METHOD OF TREATING THIN FILM

(75) Inventors: Jong-Chul Lee, Gyeongsan-si (KR); Je-Sup Lee, Gumi-si (KR); Sang-Hyuck Park, Osan-si (KR)

(73) Assignee: LG. Display Co., Ltd., Seoul (KR)

( * ) Notice: Subject to any disclaimer, the term of this patent is extended or adjusted under 35 U.S.C. 154(b) by 49 days.

(21) Appl. No.: 11/235,014

(22) Filed: Sep. 22, 2005

(65) Prior Publication Data

US 2006/0060140 A1 Mar. 23, 2006

(30) Foreign Application Priority Data

Sep. 23, 2004 (KR) .................. 10-2004-0076582

(51) Int. Cl.
*C23C 16/48* (2006.01)
*H01L 21/306* (2006.01)
(52) U.S. Cl. ............... 118/715; 156/345.33; 156/345.34
(58) Field of Classification Search ................. 118/722; 156/345.33, 345.34
See application file for complete search history.

(56) References Cited

U.S. PATENT DOCUMENTS

| | | | | |
|---|---|---|---|---|
| 4,801,352 A | * | 1/1989 | Piwczyk | 156/345.5 |
| 5,422,139 A | * | 6/1995 | Fischer | 427/248.1 |
| 5,595,606 A | * | 1/1997 | Fujikawa et al. | 118/725 |
| 6,090,458 A | * | 7/2000 | Murakami | 427/586 |
| 2001/0027026 A1 | * | 10/2001 | Dhindsa et al. | 438/712 |
| 2005/0030496 A1 | * | 2/2005 | Chibana et al. | 355/30 |
| 2008/0069966 A1 | * | 3/2008 | Otsuki | 427/453 |

FOREIGN PATENT DOCUMENTS

| | | |
|---|---|---|
| JP | 10-280152 | * 10/1998 |
| JP | 10-324973 | * 12/1998 |
| KR | A2 2004-0002662 | 1/2004 |

OTHER PUBLICATIONS

Webster's New World Dictionary, The World Publishing Co., 1972, p. 617.*

* cited by examiner

*Primary Examiner*—Ram N Kackar
*Assistant Examiner*—Satish Chandra
(74) *Attorney, Agent, or Firm*—Brinks Hofer Gilson & Lione

(57) ABSTRACT

An apparatus for treating a substrate includes a stage adapted to receive the substrate; a gas shield facing the substrate and having a retention space, the gas shield including: a top plate; a bottom plate facing the substrate and having pump holes around the retention space; and a middle plate between the top and bottom plates and having a first gas path communicating with the retention space and a second gas path communicating with the pump holes; an energy source facing the top plate such that light emitted therefrom irradiates a part of the substrate through the retention space; a reaction gas supplier connected to the first gas path; and a pressure adjusting device connected to the second gas path.

10 Claims, 7 Drawing Sheets

APPARATUS FOR TREATING THIN FILM AND METHOD OF TREATING THIN FILM

The present invention claims benefit of Korean Patent Application No. P2004-0076582, filed in Korea on Sep. 23, 2004, which is hereby incorporated by reference.

BACKGROUND OF THE INVENTION

1. Field of the Invention

The present invention relates to an apparatus for treating a thin film and a method of treating a thin film.

2. Background of the Related Art

Until recently, display devices have typically used cathode-ray tubes (CRTs). Presently, much effort is being expended to study and develop various types of flat panel displays, such as liquid crystal display (LCD) devices, plasma display panels (PDPs), field emission displays, and electro-luminescence displays (ELDs), as a substitute for CRTs.

These flat panel displays have a light emitting layer or a light polarizing layer on at least one transparent substrate. Recently, an active matrix type flat panel display, where a plurality of thin film transistors (TFTs) are arranged in a matrix manner, has become widely used due to high resolution and high ability of displaying moving images.

The flat panel display includes multiple thin films. Accordingly, the flat panel display is fabricated through the repetition of a thin film-depositing process, a photolithography process and a thin film-etching process. Also, when a thin film pattern formed through such the processes has defects such as open circuits and short circuits, a process for repairing such the defects of the thin film pattern is conducted.

A thin film-treating process such as a depositing process, an etching process and a repairing process is conducted in a chamber type thin film-treating apparatus having an airtight reaction area. However, large sized substrates are problematic for the chamber type apparatus. In other words, as a size of the flat panel display recently has increased, a size of the chamber also increases in accordance to a size of the substrate. In particular, the flat panel display recently has used a substrate having a size of about square meters (m$^2$). Accordingly, the space occupied by the chamber type apparatus increases.

To solve these problems, instead of the chamber type apparatus requiring a large-sized airtight reaction space, a gas shield type thin film-treating apparatus for treating a part of a substrate under atmospheric condition is suggested.

FIG. 1 is a cross-sectional view of a gas shield type thin film-treating apparatus according to the related art.

As shown in FIG. 1, a gas shield type thin film-treating apparatus uses laser-induced chemical vapor deposition method. In other words, thin film treatment is conducted by photolysis using a light to irradiate a part of a substrate 2 and a reaction gas supplied to the irradiated part of the substrate 2 under atmospheric pressure.

The gas shield type apparatus includes a stage 10 where the substrate 2 is placed, a gas shield 20 over the stage 10, and an energy source 40 over the gas shield 20.

The stage 10 moves up/down and left/right i.e., horizontally and vertically, by using an operating assembly (not shown). The gas shield 20 has a retention space 22, which is open up and down, disposed at a center portion of the gas shield 20 corresponding to the energy source 40. The upper open portion of the retention space 22 is shielded by a transparent window 24. A laser beam "L" irradiates a part of the substrate 2 through the transparent window 24 and the retention space 22. A gas supply path 26 is formed in the gas shield 20 and connected to the retention space 22 to supply the reaction gas. The gas supply path 26 is connected to a gas supplier 50 through a gas supply pipe 52. A plurality of exhaust grooves 28 and 32 are formed at a rear surface of the gas shield 20 facing the substrate 2 to exhaust the residual reaction gas on the substrate 2. Gas exhaust paths 30 and 34 are formed in the gas shied 20 and connected to the corresponding exhaust grooves 28 and 32. Also, the gas exhaust paths 30 and 34 are connected to a pressure adjusting device 54 through a gas exhaust pipe 56. The energy source 40 generates light such as a laser beam "L". The laser beam "L" passes through the transparent window 24 and the retention space 22 and is focused on the part of the substrate 2.

The substrate 2 is placed on the stage 10, and the stage 10 moves to align the energy source 40 and the gas shield 20 with the substrate 2. Then, the laser beam "L" from the energy source 40 is focused on the part of the substrate 2, and the reaction gas is supplied to the retention space 22 through the gas supply pipe 52 and the gas supply path 26 and flows into the focused part of the substrate 2. The reaction gas is activated by the laser beam "L" at the focused part of the substrate 2, and thus a thin film treatment such as depositing and etching is conducted at the part of the substrate 2. During the thin film treatment, the gas exhaust paths 30 and 34 and the gas exhaust pipe 56 are under negative pressure by the pressure adjusting device 54 to prevent the poisonous reaction gas and a gaseous by-product from leaking outside. Accordingly, the residual reaction gas and the gaseous by-product are continuously exhausted through the exhaust grooves 28 and 32.

Through the above-explained processes, the related art gas shield type apparatus conducts the thin film treatment for the part of the substrate under atmospheric condition. However, the related art gas shield type apparatus has some problems.

Since the thin film treatment is conducted under atmospheric pressure, a large amount of reaction gas is wasted and is not used for the thin film treatment. In other words, since gas supplying and gas exhausting are conducted at the same time, a large amount of reaction gas is wasted and is not used for the thin film treatment. Accordingly, the rate and efficiency of the thin film treatment are reduced. Further, the moving speed of the stage is limited. For example, when a repairing process to connect an open-circuited thin film pattern is conducted, the irradiating range of the laser beam, i.e. the focusing area is about 300 μm$^2$ while the moving speed of the stage is about 3 to 10 μm/sec. Accordingly, the total process time for one substrate, i.e. a total around cycle time (TACT), is large.

Further, a supplying pressure and an exhausting pressure of the reaction gas are different according to positions of the substrate, and thus uniformity of the thin film treatment is reduced. In other words, in the related art gas shield type apparatus, since the thin film-treatment is conducted under atmospheric pressure, maintaining constant pressure for supplying and exhausting the reaction gas is problematic compared with the chamber type thin film-treating apparatus. In particular, since distances from the respective exhaust grooves 28 and 32 to the pressure adjusting device 54 are different, pressures for exhausting the reaction gas are different according to positions of the exhaust grooves. Accordingly, uniformity of the thin film treatment is reduced.

Further, the related art gas shield type apparatus occupies a large area. In other words, the gas supply path 26 is disposed at a height different from the gas exhaust paths 30 and 34 in the gas shield 20, and thus the gas shield 20 has an indispensable thickness to some degree. Also, the exhaust grooves 28 and 32 include a first groove 28 disposed around the retention space 22 and a second groove 32 disposed around the first groove 28, and thus the gas exhaust paths 30 and 34 are independent from each other. Accordingly, the gas shield 20 has large thickness and volume.

Further, due to a large size of the gas shield 20, the stage 10 is movable in order to reduce the generation of impurities such as particles and to simplify the operation. Accordingly, the occupation area used by the apparatus is about two times the size of the substrate 2.

Further, the reaction gas in the gas supply path 26 and the residual reaction gas in the gas exhaust path 30 and 34 are cooled or hardened in the corresponding gas paths 26, 30 and 34. Accordingly, the cooled or hardened reaction gas acts as particles and thus contaminates the substrate 2 or blocks the gas paths 26, 30 and 34.

SUMMARY OF THE INVENTION

An apparatus and method for treating a thin film is presented that improves uniformity of a thin film treatment, reduces an occupation area for the apparatus and prevents contamination of a substrate and blocking of a gas path.

By way of example, as embodied and broadly described, an apparatus for treating a thin film on a substrate includes a stage adapted to receive the substrate; a gas shield facing the substrate and having a retention space, the gas shield including: a top plate; a bottom plate facing the substrate and having a plurality of pump holes around the retention space; and a middle plate between the top and bottom plates and having a first gas path in communication with the retention space and a second gas path in communication with the plurality of pump holes; an energy source facing the top plate such that light emitted therefrom irradiates a part of the substrate through the retention space; a reaction gas supplier connected to the first gas path; and a pressure adjusting device connected to the second gas path.

In another aspect, a method of treating a thin film on a substrate includes placing the substrate on a stage; irradiating a part of the substrate with light from an energy source through a retention space of a gas shield; supplying a reaction gas to the part of the substrate through the retention space; and forming a gaseous curtain between the gas shield and the substrate around the retention space.

In another aspect, an apparatus for treating a substrate, comprises: a stage adapted to receive the substrate; a gas shield facing the substrate, the gas shield having a retention space and having multiple plates with first, second, and third unconnected gas paths disposed therein, the gas paths each having an introduction port through which gas is introduced and an exit port from which the gas exits; an energy source facing the top plate such that light emitted therefrom irradiates a part of the substrate through the retention space; a reaction gas supplier connected to the first gas path; and independently operable pressure adjusting devices connected to the second and third gas paths, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiments of the present invention, which are illustrated in the accompanying drawings.

Figure 1:
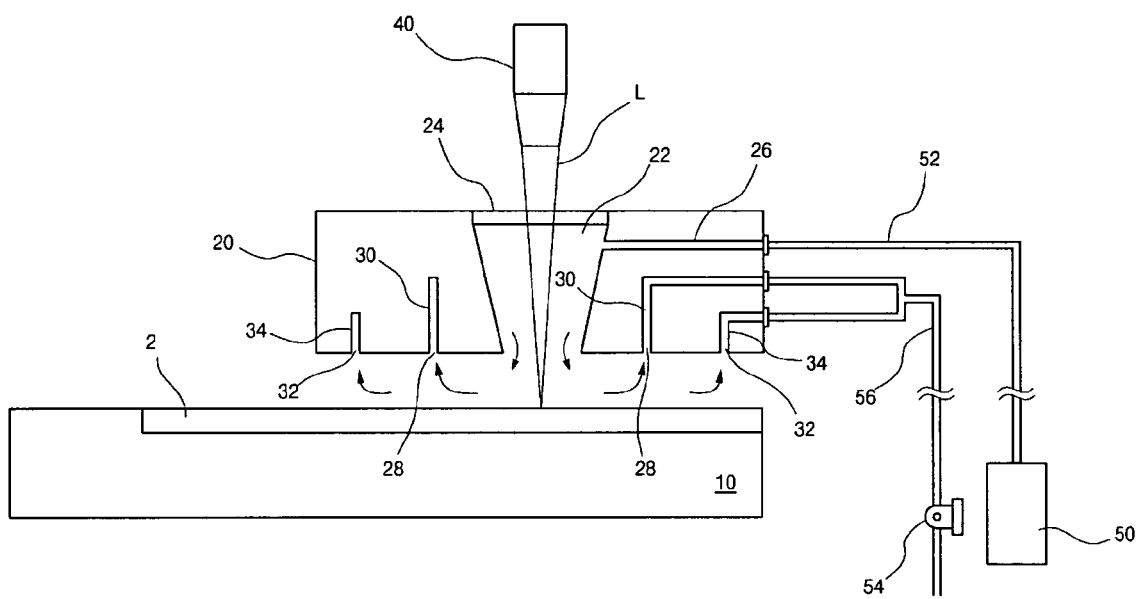
FIG. 1 is a cross-sectional view of a gas shield type thin film-treating apparatus according to the related art.
Figure 2:
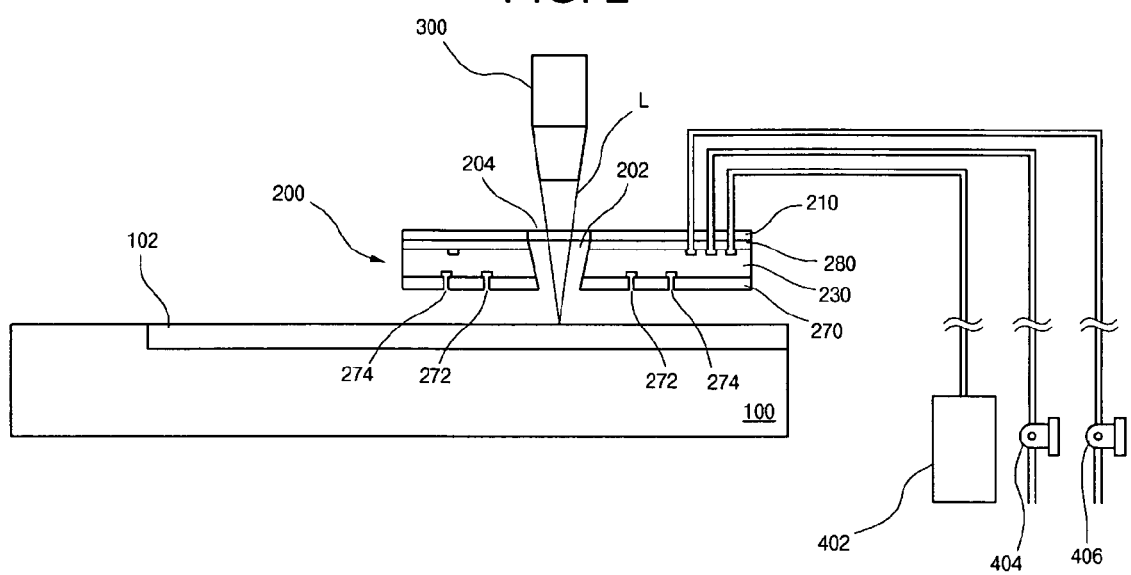
FIG. 2 is a cross-sectional view of a gas shield type thin film-treating apparatus according to an embodiment of the present invention.

FIG. 2 is a cross-sectional view of a gas shield type thin film-treating apparatus according to an embodiment of the present invention. The thin film-treating apparatus according to the embodiment of the present invention is applicable not only to flat panel displays but also to devices including thin films such as semiconductor devices. The process of treating a thin film includes processes related to forming a thin film on a substrate such as depositing, etching, repairing and the like.

As shown in FIG. 2, the thin film-treating apparatus includes a stage 100 where a substrate 102 is placed, a gas shield 200 disposed over and facing the substrate 102, and an energy source 300 over the gas shield 200. The stage 100 may move up/down and left/right, i.e., horizontally and vertically, by using an operating assembly such as a motor and a cylinder. Also, the stage 100 may be fixed while the gas shield 200 and the energy source 300 may move up/down and left/right, i.e., horizontally and vertically, to the substrate 102 by using an operating assembly.

The gas shield 200 is spaced apart from the substrate 102 by several micrometers to several hundred micrometers. The gas shield 200 may be made of aluminum (Al) and have a circle-banded shape or a polygon-banded shape. A retention space 202 is disposed at a center portion of the gas shield 200. The retention space 202 may have a width of about 2 mm to 5 mm. The retention space 202 is open up and down, and upper open portion of the retention space 202 is shielded by a transparent window 204. The transparent window 204 may be made of quartz. As the transparent window 204, a non-reflective plane lens may be used.

In the gas shield 200, a first gas path is formed to connect a gas supplier 402 and the retention space 202, and a second gas path is formed to connect a plurality of pump holes 272 and 274 and a pressure adjusting device 404 and 406. The pump holes 272 and 274 are formed in a rear surface of the gas shield 200.

Through the retention space 202 open up and down, a laser beam "L" emitted from the energy source 300 irradiates a part of the substrate 102 through the transparent window 204 and the retention space 202. The energy source 300 may emit radiation such as ultraviolet (UV) radiation, radio frequency (RF) radiation or u-wave radiation as well as or instead of the laser beam "L".

In the embodiment of the present invention, the gas shield 200 includes a plurality of plates 210, 230, 270 and 280 stacked. Accordingly, the first and second gas paths are formed in the plates 210, 230, 270 and 280. Hereinafter, the gas shield 200 having multiple plates 210, 230, 270 and 280 is explained in detail with reference to FIGS. 2 and 3.

Figure 3:
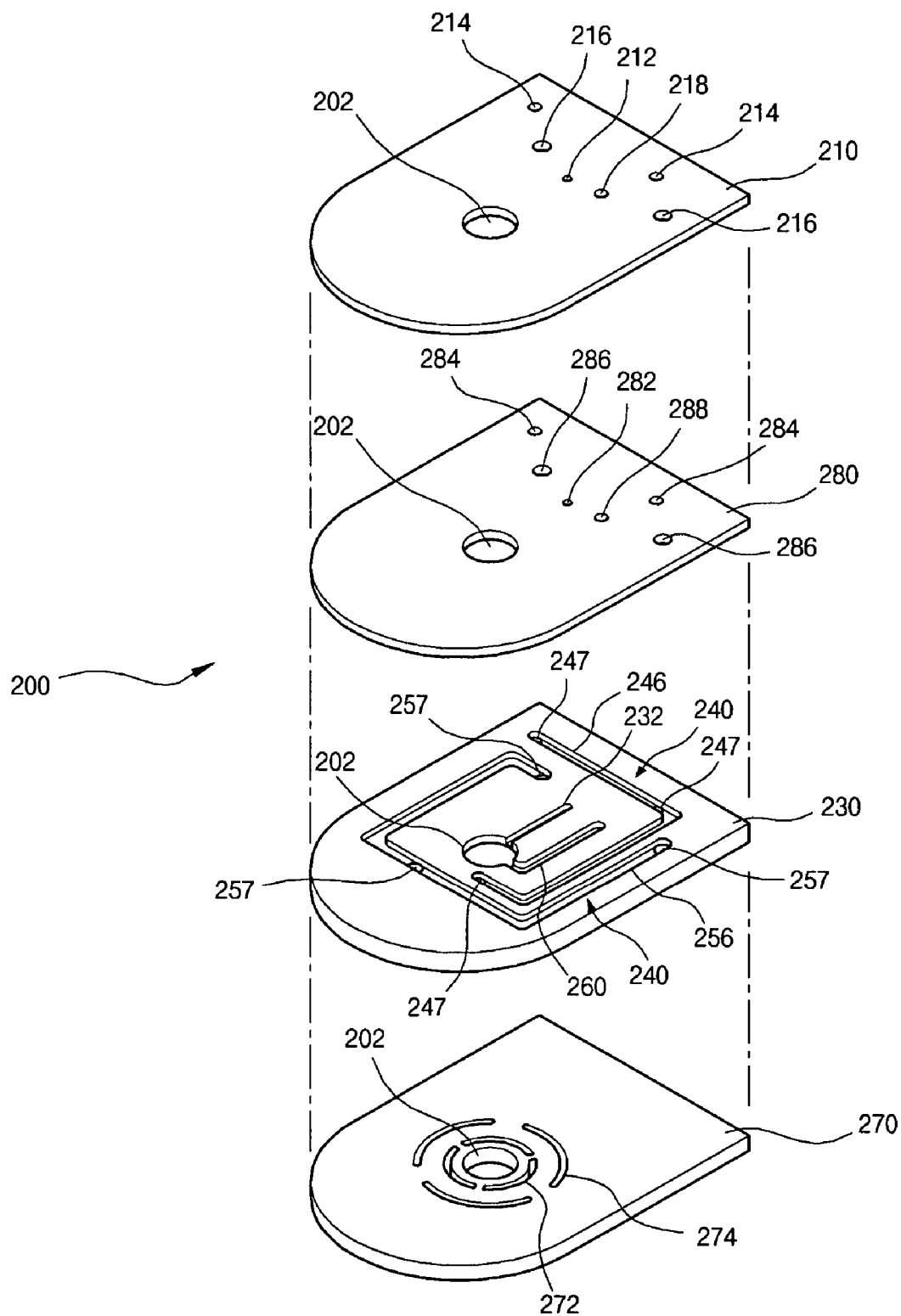
FIG. 3 is an exploded perspective view of a gas shield of a gas shield type thin film-treating apparatus according to the embodiment of the present invention.

FIG. 3 is an exploded perspective view of a gas shield of a gas shield type thin film-treating apparatus according to the embodiment of the present invention.

As shown in FIGS. 2 and 3, the gas shield 200 includes at least three plates i.e., a top plate 210, a bottom plate 270 and a middle plate 230 between the top and bottom plates 210 and 270. The top plate 210 is a top portion of the gas shield 200 adjacent to the energy source 300, and the transparent window 204 is adapted to the top plate 210. The bottom plate 270 is a bottom portion of the gas shield 200 facing the substrate 102, and the pump holes 272 and 274 are formed open up and down in the bottom plate 270. The middle plate 230 includes first and second gas paths 232 and 240. The first gas path 232 communicates with the retention space 202 and the second gas path 240 communicates with the pump holes 272 and 274.

The first gas path 232 is formed at a front surface of the middle plate 230 and has a groove shape. The second gas path 240 is formed at front and rear surfaces of the middle plate 230 and has a groove shape. The second gas path 240 of the front surface communicates with the second gas path 240 of the rear surface through a plurality of connection holes 247 and 257 open up and down. Hereinafter, the middle plate 230 is explained in detail with reference to FIGS. 2 to 4C.

Figure 4A:
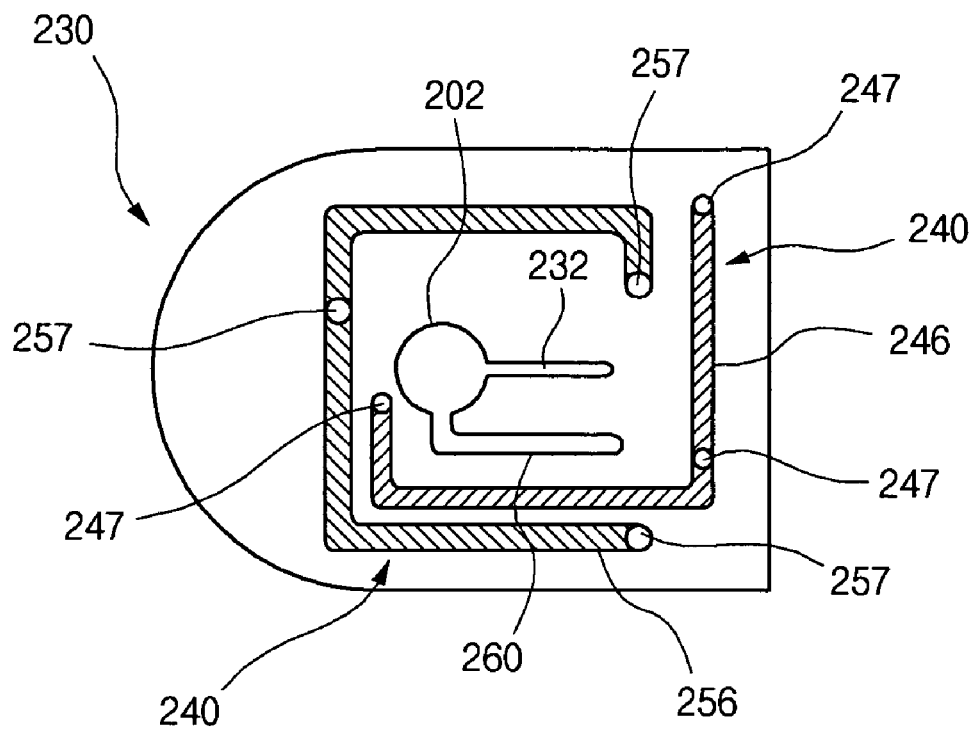
FIG. 4A is a plan view of a front surface of the middle plate according to the embodiment of the present invention.
Figure 4B:
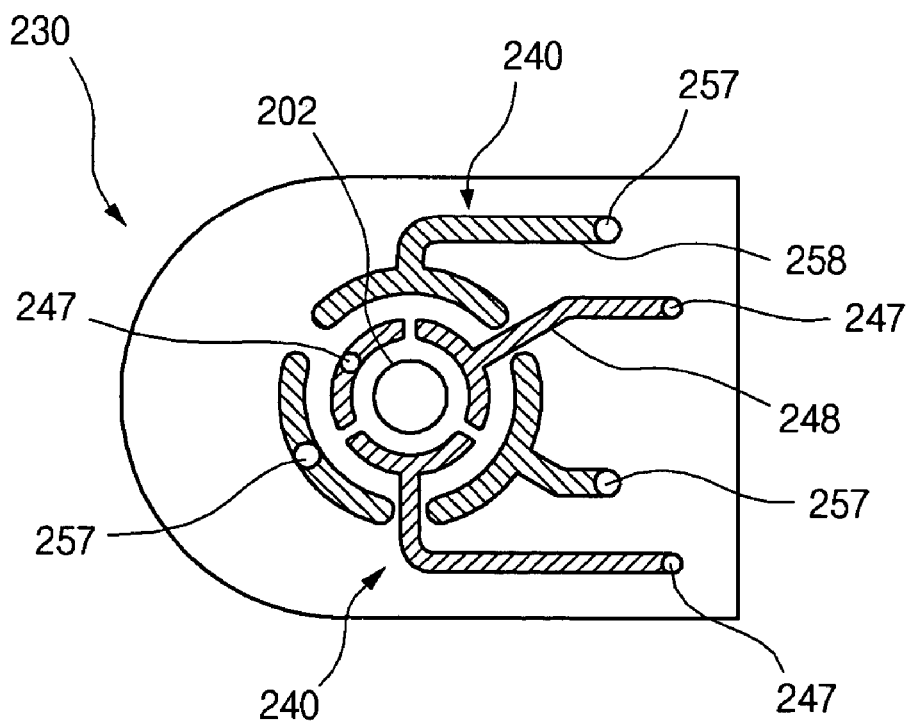
FIG. 4B is a plan view of a rear surface of the middle plate according to the embodiment of the present invention.
Figure 4C:
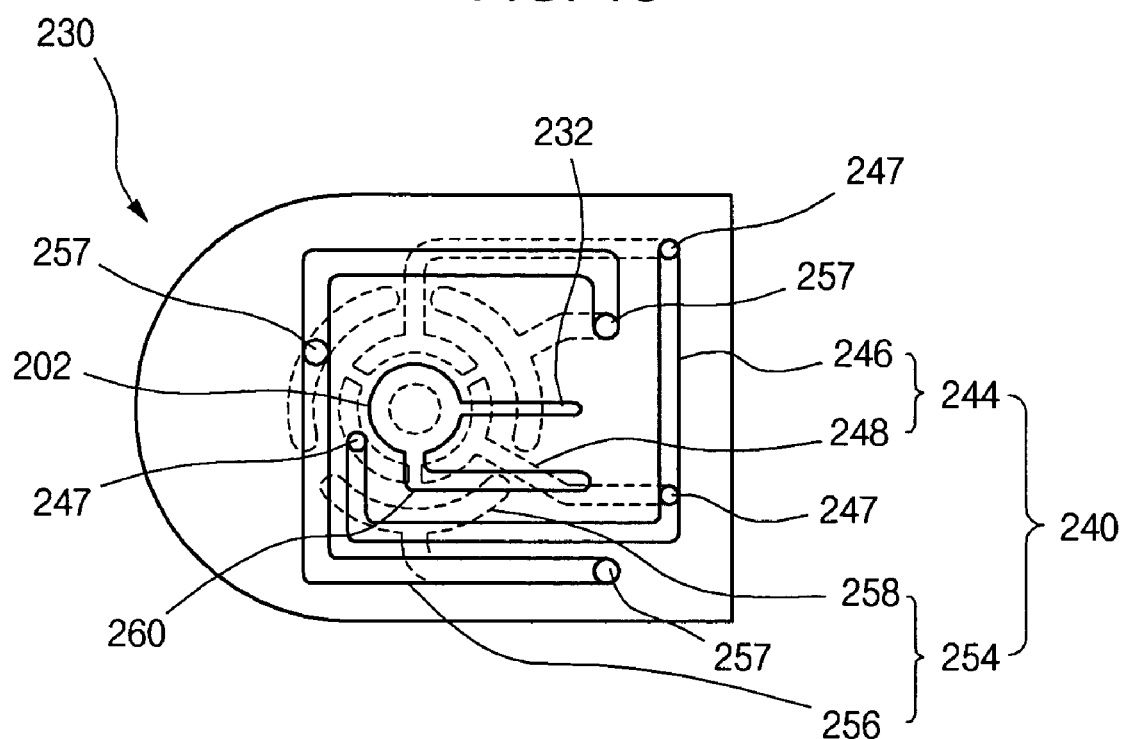
FIG. 4C is a view illustrating connection structures of the first and second paths of the middle plate according to the embodiment of the present invention.

FIG. 4A is a plan view of a front surface of the middle plate according to the embodiment of the present invention, FIG. 4B is a plan view of a rear surface of the middle plate according to the embodiment of the present invention, and FIG. 4C is a view illustrating connection structures of the first and second paths of the middle plate according to the embodiment of the present invention.

As shown in FIGS. 2 to 4C, the first gas path 232 is formed at the front surface of the middle plate 230. The second gas path 240 includes a first gas sub-path 244 and a second gas sub-path 254 formed at both the front and rear surfaces of the middle plate 230. The first and second gas sub-paths 244 and 254 are independent from each other. The first gas sub-path 244 includes a first front gas sub-path 246 and a first rear gas sub-path 248 formed at the front and rear surfaces of the middle plate 230, respectively, and the second gas sub-path 254 includes a second front gas sub-path 256 and a second rear gas sub-path 258 formed at the front and rear surfaces of the middle plate 230, respectively. The first front gas sub-path 246 communicates with the first rear gas sub-path 248 through a plurality of first connection holes 247, and the second front gas sub-path 256 communicates with the second rear gas sub-path 258 through a plurality of second connection holes 257. The first rear gas sub-path 248 has a broken ring shape around the retention space 202, and the second rear gas sub-path 258 has a broken ring shape around the first rear sub-path 248. Each of the first and second rear gas sub-paths 248 and 258 is divided into multiple portions. However, the multiple-divided portions of the first rear gas sub-path 248 communicate with one another through the first connection holes 247 and the first front gas sub-path 246, and the multiple-divided portions of the second rear gas sub-path 258 also communicate with one another through the second connection holes 257 and the second front gas sub-path 256. The respective front gas sub-paths 246 and 256 may have different groove shapes from the respective rear gas sub-paths 248 and 258.

A third gas path 260 may be formed at the front surface of the middle plate 230 and have a groove shape. The third gas path 260 is connected to an inert gas supplier (not shown), and thus an inert gas from the inert gas supplier is supplied to the retention space 202 through the third gas path 260.

The first gas path 232 is connected to the reaction gas supplier 402, and the second gas path 240 is connected to the pressure adjusting device 404 and 406. In particular, the pressure adjusting device 404 and 406 includes first and second inhalation-exhaust pumps 404 and 406 that communicate with the first and second gas sub-paths 244 and 254, respectively. The inhalation-exhaust pump 404 or 406 causes inhaling or exhausting selectively through the gas paths. Accordingly, each of the first and second inhalation-exhaust pumps 404 and 406 supplies a negative pressure or an inert gas to each of the first and second sub-paths 244 and 254. To inhale or exhaust, the inhalation-exhaust pumps 404 and 406 may include a sucking device and a blowing device connected in parallel to each other.

As shown in FIGS. 2 and 3, the top plate 210 covers a top surface of the middle plate 230. Thus, the first gas path 232, each of the first and second front gas sub-paths 246 and 256 and the third gas path 260 disposed at the front surface of the middle plate 230 becomes blocked and does not have an open upper portion. The top plate 210 includes a first port hole 212 that communicates with the first gas path 232, a second port hole 214 that communicates with the first front gas sub-path 246 and a third port hole 216 that communicates with the second front gas sub-path 256. The first port hole 212 is connected to the reaction gas supplier 402, the second port hole 214 is connected to the first inhalation-exhaust pump 404, and the third port hole 216 is connected to the second inhalation-exhaust pump 406. Each of the first to third port holes 212, 214 and 216 may have multiple openings. In addition, the top plate 210 may further include a fourth port hole 218 that communicates with the third gas path 260. The first to fourth port holes 212, 214, 216 and 218 are open up and down.

The bottom plate 270 is attached to the rear surface of the middle plate 230. The bottom plate 270 includes a plurality of first pump holes and second pump holes 272 and 274 open up and down. The first pump holes 272 correspond to and communicate with the multiple-divided portions of the first rear gas sub-path 248, and the second pump holes 274 correspond to and communicate with the multiple-divided portions of the second rear gas sub-path 258. Accordingly, the first pump holes 272 are formed around the retention space 202 and have a broken ring shape, and the second pump holes 274 are formed around the ring-shaped first pump holes 272 and have a broken ring shape. In other words, the first pump holes 272 are separated from each other, and the second pump holes 274 are separated from each other.

As explained above, the first port hole 212 is connected to the retention space 202 through the first gas path 232. The second port hole 214 is connected to the first pump holes 272 through the first front gas sub-path 246, the first connection hole 247 and the first rear gas sub-path 248. The third port hole 216 is connected to the second pump holes 274 through the second front gas sub-path 256, the second connection hole 257 and the second rear gas sub-path 258. The fourth port hole 218 is connected to the retention space 202 through the third gas path 260.

In the embodiment of the present invention, the gas shield 200 may further include a heat plate 280. Although the heat plate 280 is disposed between the top and middle plates 210 and 230 in FIG. 3, the heat plate 280 may be disposed at different positions, for example, between the middle and bottom plates 230 and 270. The heat plate 280 heats gases passing through the gas paths and holes to prevent cooling and hardening of the gases. To maintain gas flow in the gas shield 200, the heat plate 280 also has structures for gas flow. When the heat plate 280 is interposed between the top and middle plates 210 and 230, the heat plate 280 may include a first inter hole 282 that communicates with the first port hole 212, a second inter hole 284 that communicates with the second port hole 214, a third inter hole 286 that communicates with the third port hole 216, and a fourth inter hole 218 that communicates with the fourth port hole 218. In addition, when the heat plate 280 is interposed between the middle and bottom plates 230 and 270, the heat plate 280 may have an inter hole connecting the first rear gas sub-path 248 and the first pump holes 272, and an inter hole connecting the second rear gas sub-path 258 and the second pump holes 274.

Further, although not shown, O-rings may be interposed around a periphery portion between the top and middle plates 210 and 230 and between the middle and bottom plates 230 and 270.

Hereinafter, operation of the gas shield type thin film-treating apparatus according to the embodiment of the present invention is explained with reference to FIGS. 2 to 5.

Figure 5:
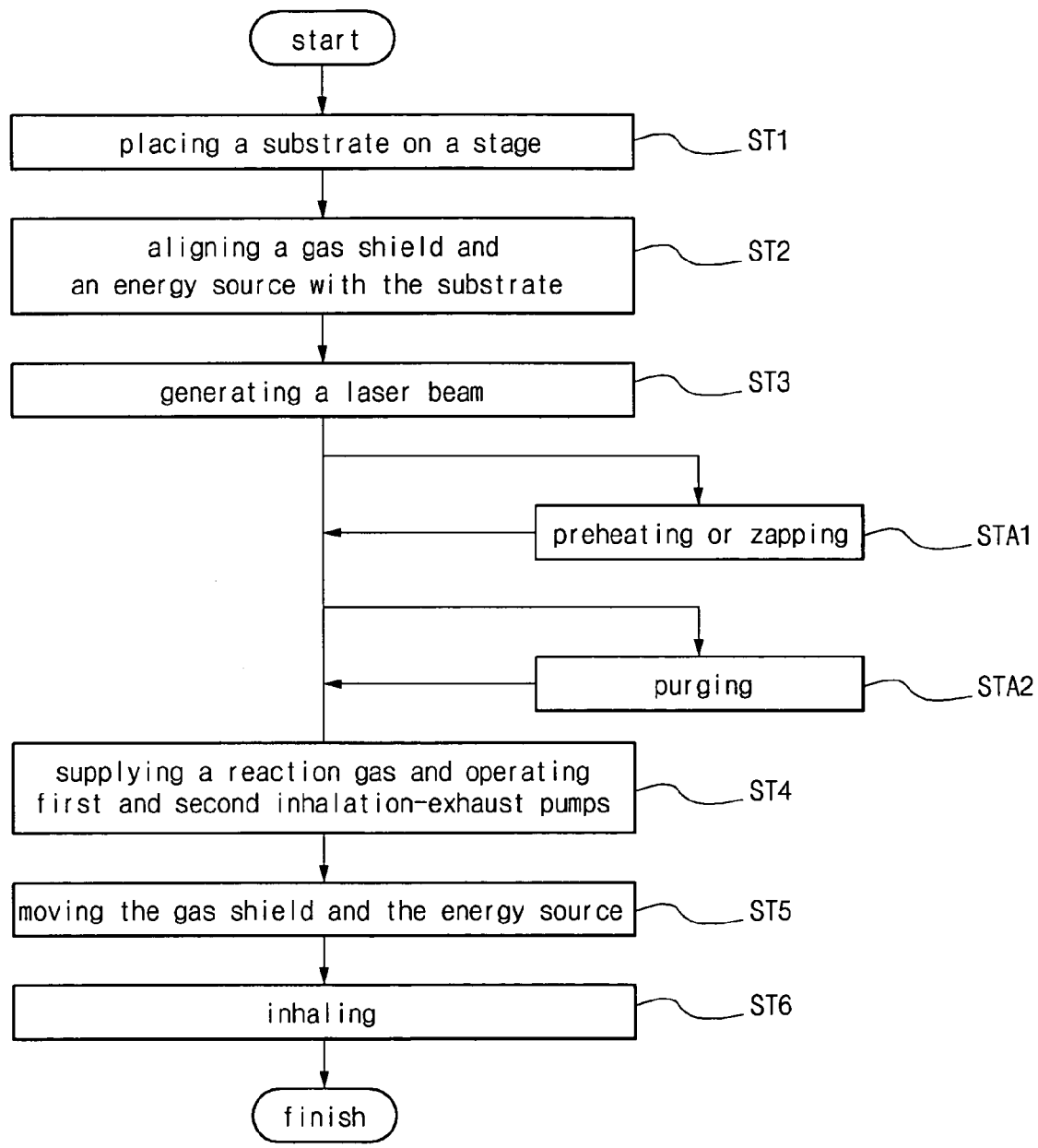
FIG. 5 is a flow chart illustrating operation of the gas shield type thin film-treating apparatus according to the embodiment of the present invention.

FIG. 5 is a flow chart illustrating operation of the gas shield type thin film-treating apparatus according to the embodiment of the present invention.

As shown in FIGS. 2 to 5, in a first step (ST1), the substrate 102 is placed on the stage 100. The substrate 102 may be a substrate where a thin film will be deposited or a substrate where a thin film has been previously deposited.

Then, in a second step (ST2), the gas shield 200 and the energy source 300 moves to be aligned with the substrate 102. Then, in a third step (ST3), the energy source 300 generates the laser beam "L", and the laser beam "L" is focused on and irradiates a part of the substrate 102.

Then, in a fourth step (ST4), the reaction gas is supplied to the first port hole 212 from the reaction gas supplier 402. The reaction gas supplied to the first port hole 212 passes through the first gas path 232 to the retention space 202, and then the reaction gas flows into the focused part of the substrate 102.

Meanwhile, before the fourth step (ST4) and after the third step (ST3), other steps may be added. For example, as a first added step (STA1), only the laser beam "L" without the reaction gas may irradiate the part of the substrate 102 to preheat the part of the substrate 102, or a zapping process may be conducted that a topmost insulating layer previously deposited is removed. In addition, as a second added step (STA2), an inert gas may be supplied to the retention space 202 to purge the retention space 202 and the part of the substrate 202 which will be treated, or to act as a buffer gas when the inert gas is supplied along with the reaction gas. The purging with the inert gas may be conducted before the third step (ST3) and after the second step (ST2). The inert gas is supplied to the fourth port hole 218 from the inert gas supplier (not shown) and then passes through the third gas path 260 to the retention space 202.

In the fourth step (ST4), at the same time as the reaction gas supplied, the first and second inhalation-exhaust pumps 404 and 406 may operate. The operation of the first and second inhalation-exhaust pumps 404 and 406 may operate opposite (one inhaling and the other exhaling) or the same (both inhaling or both exhaling).

For example, while the first inhalation-exhaust pump 404 may inject an inert gas in an exhaust operation, the second inhalation-exhaust pump 406 may inhale the inert gas in an inhalation operation or vice-versa. Since the first and second inhalation-exhaust pumps 404 and 406 operate with inhalation and exhaust opposite to each other, a space below the retention space 202 is shielded from the outside. Accordingly, most of the reaction gas is used for the thin film treatment and is not wasted. In other words, to prevent wasting of the reaction gas, at the same time as the reaction gas supplied, the first pump holes 272 and the second pump holes 274 inhale and inject the inert gas opposite to each other.

Figure 6:
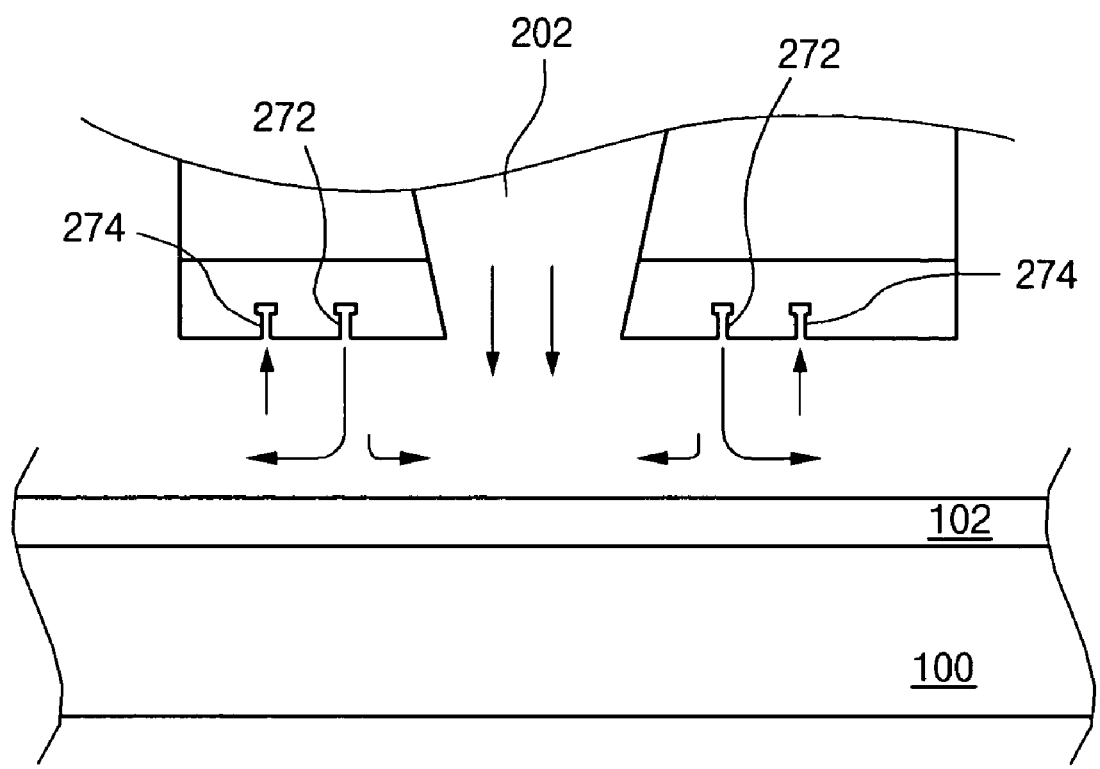
FIG. 6 is a conceptual cross-sectional view illustrating a gas flow when the first inhalation-exhaust pump injects an inert gas and the second inhalation-exhaust pump inhale the inert gas according to the embodiment of the present invention.

FIG. 6 is a conceptual cross-sectional view illustrating a gas flow when the first inhalation-exhaust pump injects an inert gas and the second inhalation-exhaust pump inhale the inert gas according to the embodiment of the present invention.

As shown in FIG. 6, the first pump holes 272 inject an inert gas, and thus the inert gas acts as a gaseous curtain to prevent the reaction gas from being wasted outside. Accordingly, the reaction gas is mostly confined in a space surrounded by the curtain and is used for the thin film treatment. The second pump holes 274 inhale mostly the inert gas.

In addition, contrary to the operation in FIG. 6, when the first pump holes 272 inhale the inert gas and the second pump holes 274 inject the inert gas, although the small amount of the reaction gas is inhaled through the first pump holes 272, mostly the reaction gas is used for the thin film treatment. Therefore, usability of the reaction gas can increase.

In addition, both the first and second pump holes 272 and 274 may operate only with inhalation or exhaust.

The reaction gas supplied to the part of the substrate 102 due to the operation of the first and second pump holes 272 and 274 is activated by the laser beam "L", and thus the thin film treatment is conducted.

The thin film treatment may be conducted along a continuous line by movement of the gas shield 200 and the energy source 300, as a fifth step (ST5).

When the thin film treatment is finished, the residual reaction gas are inhaled through the first and second pump holes 272 and 274, as a sixth step (ST6), to prevent leakage of the poisonous reaction gas to the outside.

Meanwhile, since the heat plate 280 heats gases passing through it during the thin film treatment, gases passing through gas channels such as the paths and holes in the gas shield 230 are prevented from being cooled or hardened.

In the embodiment of the present invention, shapes and volumes of the first and second gas paths 232 and 240, the first and second connection holes 247 and 257, and the first and second port holes 212 and 214 may be adjusted such that the first and second pump holes 272 and 274 inject and inhale the inert gas uniformly regardless of their positions.

As explained above, the space for the thin film treatment below the retention space is shielded from the outside. Accordingly, most of the reaction gas is used for the thin film treatment, and thus the rate and efficiency of the thin film treatment increases.

Further, the inhalation pressure and the exhaust pressure are adjusted uniformly through the first and second pump holes regardless of positions. Accordingly, uniformity of the thin film treatment increases.

Further, a size of the gas shield type thin film-treating apparatus can be reduced. In other words, it is enough that the top plate and the bottom plate only have a thickness to cover the front and rear surfaces of the middle plate, and it is enough that the middle plate only has a thickness to form grooves for the gas paths. Accordingly, the gas shield can have a small size, and thus the gas shield type apparatus also has a small size.

Further, since the gas shield and energy source have a small size and are movable, impurities such as particles can be reduced and structures can be simplified. If the stage is fixed, the occupation area used by the apparatus is essentially the size of the substrate.

Further, the heat plate is interposed in the gas shield. Accordingly, gases flowing in the gas shield are prevented from being cooled and hardened. Also, contamination of the substrate and troubles of the apparatus can be prevented.

It will be apparent to those skilled in the art that various modifications and variations can be made in the apparatus for treating the thin film and the method of treating the thin film of the present invention without departing from the spirit or scope of the invention. For instance, the present invention may also be applied to other display devices. Thus, it is intended that the present invention cover the modifications and variations of this invention provided they come within the scope of the appended claims and their equivalents.

What is claimed is:

1. An apparatus for treating a substrate, comprising:
   a stage adapted to receive the substrate;
   a gas shield facing said substrate, said gas shield having a retention space and having top, middle and bottom plates with first, second, and third unconnected gas paths disposed therein, said gas paths each having an introduction port through which gas is introduced and an exit port from which the gas exits, wherein said retention space is surrounded by inner surfaces of said top, middle and bottom plates, wherein said first gas path is located on a top surface of said middle plate, wherein said top surface of said middle plate is parallel to said stage, and the exit port of said first gas path directly meets a middle space of said retention space, wherein said middle space is surrounded by said inner surface of said middle plate;
   an energy source facing said top plate such that light emitted therefrom irradiates a part of said Substrate through said retention space;
   a reaction gas supplier connected to said first gas path to supply reaction gas to said middle space; and
   first and second pumps connected to said second and third gas paths, respectively, wherein said first pump is capable of inhaling gas from and exhaling gas to said second gas path and said second pump is capable of inhaling gas from and exhaling gas to said third gas path,
   wherein further comprising an inert gas supplier and an inert gas path in said gas shield, said inert gas supplier connected to said inert gas path,
   wherein said reaction gas supplier and said inert gas supplier are introduced to the gas plates through different introduction ports in said top plate and connected to said retention space through different grooves in said top surface of said middle plate, and wherein said different grooves in the top surface of said middle plate directly meet the middle space of said retention space to directly supply the reaction gas from the reaction gas supplier and said inert as from said inert gas supplier to said middle space of said retention space,
   wherein the gas shield further includes a heating plate surrounding said retention space and sandwiched between at least one of said top plate and said middle plate or between said middle plate and said bottom plate.

2. The apparatus according to claim 1, wherein the introduction ports of the first, second and third gas paths are disposed on a top of the gas shield.

3. The apparatus according to claim 1, wherein each of the top, middle and bottom plates contains at least one of: grooves or holes associated with the grooves.

4. The apparatus according to claim 3, wherein the middle plate comprises grooves on opposing surfaces that are different.

5. The apparatus according to claim 4, wherein at least one groove on each surface of the middle plate surrounds at least part of another groove on the same surface.

6. The apparatus according to claim 3, wherein the bottom plate comprises a plurality of pump holes formed in substantially concentric rings surrounding the retention space.

7. The apparatus according to claim 6, wherein first pump holes of the plurality of pump holes in one of the concentric rings are unconnected with second pump holes of the plurality of pump holes in another of the concentric rings.

8. The apparatus according to claim 3, wherein a thickness of the top and bottom plate only have a thickness to cover the middle plate, and a thickness of the middle plate is substantially sufficient to form grooves for the gas paths in the middle plate.

9. The apparatus according to claim 1, wherein the first pump supplies either a negative pressure or an inert gas to the gas paths, and the second pump supplies either a negative pressure or an inert gas to the gas paths.

10. The apparatus according to claim 1, wherein a gas flow rate of the first pump and a gas flow rate of the second pump are substantially opposite one another so as to minimize waste of the reaction gas.

* * * * *

UNITED STATES PATENT AND TRADEMARK OFFICE
CERTIFICATE OF CORRECTION

PATENT NO. : 7,833,350 B2
APPLICATION NO. : 11/235014
DATED : November 16, 2010
INVENTOR(S) : Jong-Chul Lee et al.

It is certified that error appears in the above-identified patent and that said Letters Patent is hereby corrected as shown below:

In the Claims

In column 10, claim 1, line 9, after "and said inert" replace "as" with --gas--.

Signed and Sealed this
First Day of March, 2011

David J. Kappos
*Director of the United States Patent and Trademark Office*